(12) United States Patent
Tada (10) Patent No.: US 10,651,206 B2
(45) Date of Patent: May 12, 2020

(54) SEMICONDUCTOR DEVICE (71) Applicant: Japan Display Inc., Minato-ku (JP)

(72) Inventor: Masahiro Tada, Tokyo (JP)

(73) Assignee: Japan Display Inc., Minato-ku (JP)

( * ) Notice: Subject to any disclaimer, the term of this patent is extended or adjusted under 35 U.S.C. 154(b) by 36 days.

(21) Appl. No.: 16/015,286

(22) Filed: Jun. 22, 2018

(65) Prior Publication Data
US 2018/0374875 A1  Dec. 27, 2018

(30) Foreign Application Priority Data

Jun. 26, 2017 (JP) .................................. 2017-124521

(51) Int. Cl.
| | |
|---|---|
| *H01L 27/12* | (2006.01) |
| *H01L 29/861* | (2006.01) |
| *G02F 1/1362* | (2006.01) |
| *H01L 29/786* | (2006.01) |
| *H01L 27/02* | (2006.01) |
| *G02F 1/1368* | (2006.01) |
| *H01L 29/40* | (2006.01) |

(52) U.S. Cl.
CPC ...... *H01L 27/124* (2013.01); *G02F 1/136204* (2013.01); *H01L 27/0266* (2013.01); *H01L 27/1214* (2013.01); *H01L 29/78648* (2013.01); *H01L 29/861* (2013.01); *G02F 1/1368* (2013.01); *H01L 27/1225* (2013.01); *H01L 29/402* (2013.01); *H01L 29/7869* (2013.01)

(58) Field of Classification Search
CPC . H01L 27/124; H01L 29/861; H01L 27/1225; H01L 29/7869; H01L 29/402; H01L 27/1214; H01L 27/0266; H01L 29/78648; G02F 1/136204; G02F 1/1368
USPC ........................................................ 257/43
See application file for complete search history.

(56) References Cited

U.S. PATENT DOCUMENTS

2011/0127526 A1    6/2011  Kawae et al.
2012/0199827 A1*   8/2012  Shibata ............. H01L 29/78606
                                                257/43

FOREIGN PATENT DOCUMENTS

JP          2015-97277          5/2015

* cited by examiner

*Primary Examiner* — Caleen O Sullivan
(74) *Attorney, Agent, or Firm* — Oblon, McClelland, Maier & Neustadt, L.L.P.

(57) ABSTRACT

According to one embodiment, a semiconductor device includes a first gate electrode, a semiconductor layer, a first insulating layer, a second gate electrode, a second insulating layer, a third insulating layer, a first contact hole, and a first electrode. The first electrode passes through the first contact hole and electrically connects the first gate electrode, the first region and the second gate electrode.

10 Claims, 6 Drawing Sheets

SEMICONDUCTOR DEVICE

CROSS-REFERENCE TO RELATED APPLICATIONS

This application is based upon and claims the benefit of priority from Japanese Patent Application No. 2017-124521, filed Jun. 26, 2017, the entire contents of which are incorporated herein by reference.

FIELD

Embodiments described herein relate generally to a semiconductor device.

BACKGROUND

As semiconductor devices, for example, display devices which display an image are known. In an active-matrix display device, thin-film transistors (TFTs) are employed for the switching elements of pixels. Further, the thin-film transistors are provided in a non-display area (peripheral area) outside a display area (active area). The thin-film transistors provided in the non-display area include diode-connected thin-film transistors.

For example, the diode-connected thin-film transistors are connected to lines extending in the display area, and function as protective diodes which protect the switching elements of pixels from static electricity. Thus, when voltage greater than or equal to a certain level is applied to the lines of the display area, the protective diodes are configured to supply current.

DETAILED DESCRIPTION

In general, according to one embodiment, there is provided a semiconductor device comprising: a first gate electrode; a semiconductor layer which is provided above the first gate electrode, and includes a first region, a second region and a channel region located between the first region and the second region and facing the first gate electrode; a first insulating layer provided between the first gate electrode and the semiconductor layer; a second gate electrode located above the semiconductor layer and facing the channel region; a second insulating layer provided between the semiconductor layer and the second gate electrode; a third insulating layer provided above the first insulating layer, the semiconductor layer, the second insulating layer and the second gate electrode; a first contact hole penetrating the first insulating layer and the third insulating layer, and located in an area facing the first gate electrode, the first region and the second gate electrode; and a first electrode passing through the first contact hole and electrically connecting the first gate electrode, the first region and the second gate electrode.

According to another embodiment, there is provided a semiconductor device comprising: a first gate electrode; a semiconductor layer which is provided above the first gate electrode, and includes a first region, a second region and a channel region located between the first region and the second region and facing the first gate electrode; a first insulating layer provided between the first gate electrode and the semiconductor layer; a second gate electrode located above the semiconductor layer and facing the channel region; a second insulating layer provided between the semiconductor layer and the second gate electrode; a third insulating layer provided above the first insulating layer, the semiconductor layer, the second insulating layer and the second gate electrode; a first contact hole penetrating the third insulating layer, and located in an area facing the first region and the second gate electrode; a first electrode passing through the first contact hole, and electrically connecting the first region and the second gate electrode; a second contact hole penetrating the first insulating layer and the third insulating layer, and located in an area facing the first gate electrode and the second region; and a second electrode passing through the second contact hole, and electrically connecting the first gate electrode and the second region.

Embodiments will be described with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

First Embodiment

Figure 1:
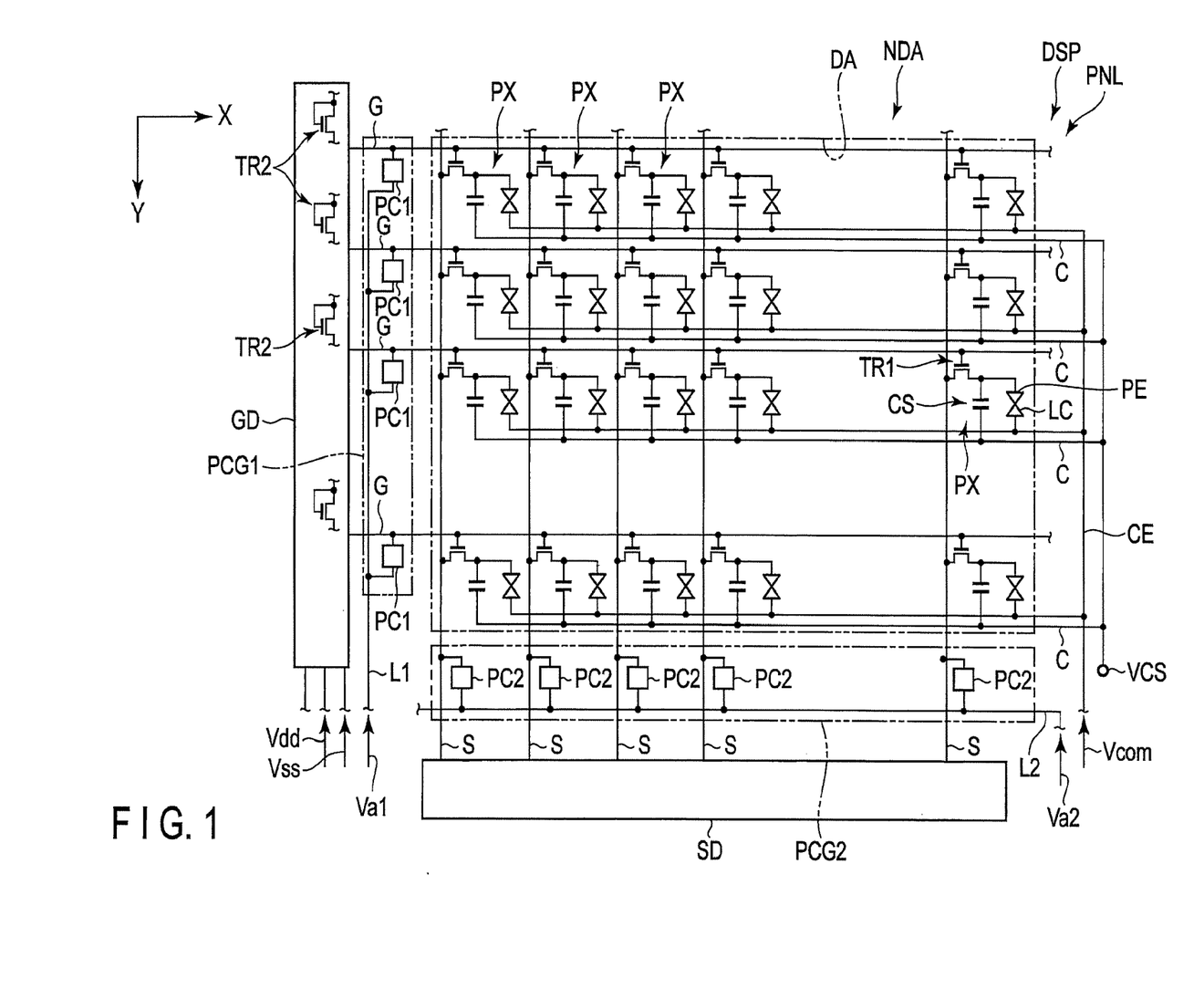
FIG. 1 is a plan view showing the structure and the equivalent circuit of a display device according to a first embodiment.

A first embodiment is explained in detail. In the present embodiment, a display device comprising thin-film transistors is explained as an example of semiconductor devices. FIG. 1 is a plan view showing the structure and the equivalent circuit of a display device DSP according to the first embodiment. As an example of the display device DSP, a liquid crystal display device is explained.

As shown in FIG. 1, the display device DSP comprises a liquid crystal display panel PNL. The liquid crystal display panel PNL comprises a display area (active area) DA which displays an image, and a non-display area (peripheral area) NDA outside the display area DA. The liquid crystal display panel PNL comprises an array substrate AR and a liquid crystal layer LC as described later, and further comprises a counter-substrate. The liquid crystal layer LC is provided between the array substrate AR and the counter-substrate.

In the display area DA, the array substrate AR comprises a plurality of scanning lines G, a plurality of auxiliary capacitance lines C, a plurality of signal lines S and a plurality of subpixels PX arranged in matrix. Each subpixel PX is sectionalized by two adjacent scanning lines G and two adjacent signal lines S. The scanning lines G and the auxiliary capacitance lines C extend substantially parallel to a first direction X. The scanning lines G or the auxiliary capacitance lines C may not linearly extend. The scanning lines G and the auxiliary capacitance lines C are alternately arranged in a second direction Y.

The signal lines S extend substantially parallel to the second direction Y. The signal lines S are substantially orthogonal to the scanning lines G and the auxiliary capacitance lines C. The signal lines S may not linearly extend. The scanning lines G, the auxiliary capacitance lines C and the signal lines S may be partially bent. The scanning lines G, the signal lines S, the auxiliary capacitance lines C, a gate electrode GE, an electrode E and a conductive layer CL as described later are formed of, for example, molybdenum, chromium, tungsten, aluminum, copper, titanium, nickel, tantalum, silver or an alloy thereof. However, they are not particularly limited to these examples and may be formed of other metals, other alloys or a stacked film thereof.

The scanning lines G extend to the outside of the display area DA and are connected to a scanning line driver GD. The signal lines S extend to the outside of the display area DA and are connected to a signal line driver SD. The auxiliary capacitance lines C extend to the outside of the display area DA and are electrically connected to a voltage applying unit VCS to which auxiliary capacitance voltage is applied.

Each subpixel PX comprises a thin-film transistor TR1, a pixel electrode PE, a common electrode CE, a storage capacitor CS and a liquid crystal layer LC. The pixel electrode PE is electrically connected to the signal line S via the thin-film transistor TR1. The common electrode CE is configured to cause the electric field formed between the common electrode CE and the pixel electrode PE to affect the liquid crystal layer LC. The common electrode CE is shared by a plurality of subpixels PX. A power supply unit located outside the display area DA applies common voltage Vcom as constant voltage to the common electrode CE. Common voltage Vcom is, for example, 0 V. Thus, the common electrode CE is set to common potential. The storage capacitor CS is electrically connected to the pixel electrode PE.

The thin-film transistor TR1 is switched to a conductive state (on) or a non-conductive state (off) by a control signal supplied from the scanning line driver GD via the scanning line G. An image signal (video signal) output from the signal line driver SD is supplied to a corresponding pixel electrode PE via the signal line S and the thin-film transistor TR1 in a conductive state. The voltage applied to the liquid crystal layer is controlled by the potential difference between the common electrode CE set to common potential and the pixel electrode PE.

The storage capacitor CS retains the voltage applied to the liquid crystal layer LC for a certain period and comprises a pair of electrodes facing each other across an intervening insulating layer. For example, in the storage capacitor CS, one of the electrodes is a part of the auxiliary capacitance line C or an auxiliary electrode electrically connected to the auxiliary capacitance line C. The other electrode is the pixel electrode PE or an auxiliary counter-electrode electrically connected to the pixel electrode PE.

The scanning line driver GD and the signal line driver SD are provided in the non-display area NDA. The scanning line driver GD and the signal line driver SD comprise a plurality of thin-film transistors. For example, the scanning line driver GD comprises a plurality of diode-connected thin-film transistors TR2. First power source voltage Vdd as constant voltage, second power source voltage Vss as constant voltage, etc., are applied to the scanning line driver GD. In the present embodiment, the first power source voltage Vdd has potential greater than that of common voltage Vcom. The second power source voltage Vss has potential less than that of common voltage Vcom. For example, the first power source voltage Vdd is +5 V. The second power source voltage Vss is −5 V.

Protective circuit groups PCG1 and PCG2 are provided in the non-display area NDA.

The protective circuit group PCG1 comprises a plurality of protective circuits PC1. The protective circuits PC1 are connected to the scanning lines G in the non-display area NDA in a one-to-one relationship. In the non-display area NDA, the protective circuit group PCG1 is located on the left side of the display area DA and is located between the display area DA and the scanning line driver GD. In the non-display area NDA, the protective circuit group PCG1 may be provided on either the right side of the display area DA or both the left side and the right side of the display area DA. The protective circuits PC1 are connected to a line L1. First adjustment voltage Va1 as constant voltage is applied to the line L1.

The protective circuit group PCG2 comprises a plurality of protective circuits PC2. The protective circuits PC2 are connected to the signal lines S in the non-display area NDA in a one-to-one relationship. In the non-display area NDA, the protective circuit group PCG2 is located on the under side of the display area DA and is located between the display area DA and the signal line driver SD. In the non-display area NDA, the protective circuit group PCG2 may be provided on either the upper side of the display area DA or both the under side and the upper side of the display area DA. The protective circuits PC2 are connected to a line L2. Second adjustment voltage Va2 as constant voltage is applied to the line L2.

The first adjustment voltage Va1 and the second adjustment voltage Va2 should be constant voltage. For example, common voltage Vcom, the first power source voltage Vdd and the second power source voltage Vss may be used for the first adjustment voltage Va1 and the second adjustment voltage Va2.

When voltage greater than or equal to a certain level is applied to the scanning lines G, the protective circuit group PCG1 is configured to supply current from the scanning lines G to the line L1 or from the line L1 to the scanning lines G. When voltage greater than or equal to a certain level is applied to the signal lines S, the protective circuit group PCG2 is configured to supply current from the signal lines S to the line L2 or from the line L2 to the signal lines S. Thus, the protective circuit group PCG1 is capable of protecting the thin-film transistors TR1 connected to the scanning lines G from static electricity. The protective circuit group PCG2 is capable of protecting the thin-film transistors TR1 connected to the signal lines S from static electricity.

Figure 2:
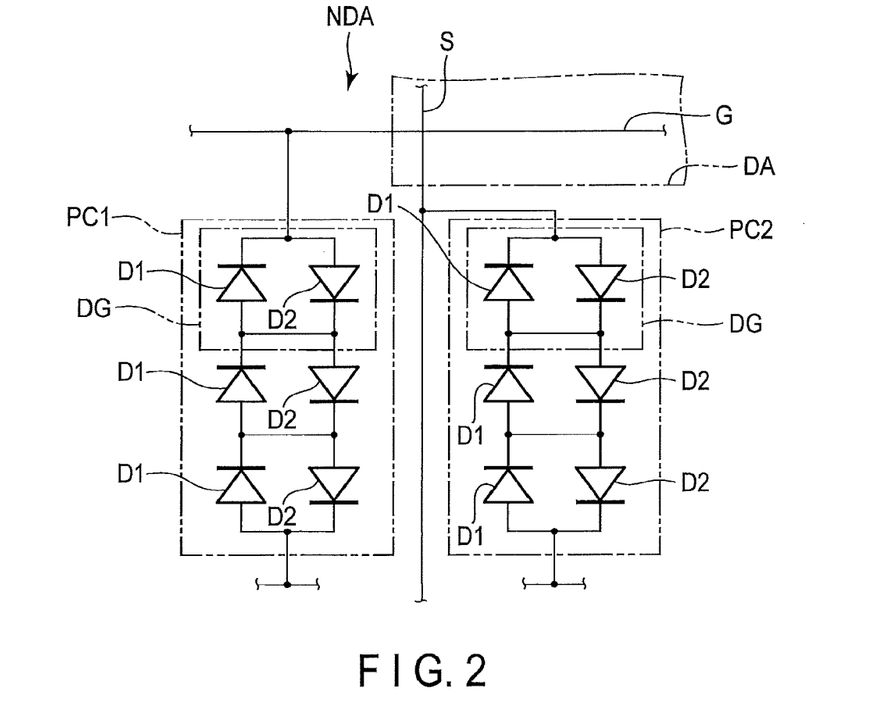
FIG. 2 shows a part of the equivalent circuit of the display device shown in FIG. 1 and shows protective circuits.

FIG. 2 shows a part of the equivalent circuit of the display device DSP shown in FIG. 1 and shows protective circuits.

As shown in FIG. 2, the protective circuits PC1 and PC2 comprise a plurality of series-parallel diodes D. In this example, the protective circuits PC1 and PC2 comprise three first diodes D1 and three second diodes D2. The three first diodes D1 are connected in series. The three second diodes D2 are connected in series. Hereinafter, two diodes D including a single first diode D1 and a single second diode D2 are referred to as a diode group DG.

Figure 3:
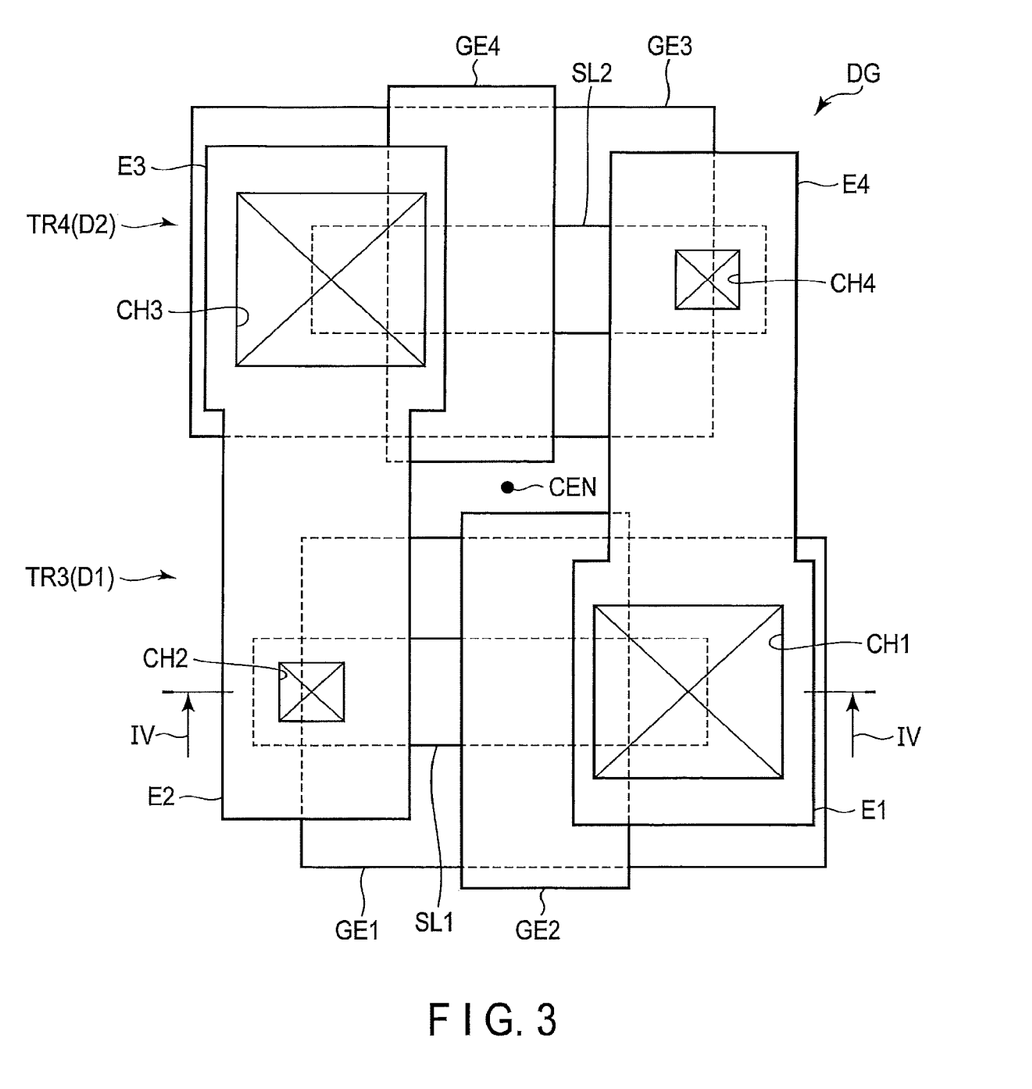
FIG. 3 is a plan view showing a part of each protective circuit.

FIG. 3 is a plan view showing a part of each protective circuit PC. Here, a single diode group DG of each protective circuit PC is explained as an example.

As shown in FIG. 3, the diode group DG comprises a diode-connected thin-film transistor TR3 and a diode-connected thin-film transistor TR4. The thin-film transistor TR3 is equivalent to the first diode D1. The thin-film transistor TR4 is equivalent to the second diode D2. The diode group DG comprises a semiconductor layer SL1, a semiconductor layer SL2, a first gate electrode GE1, a second gate electrode GE2, a third gate electrode GE3, a fourth gate electrode GE4, a first electrode E1, a second electrode E2, a third electrode E3 and a fourth electrode E4.

The second gate electrode GE2 overlaps the first gate electrode GE1. The third gate electrode GE3 is located away from the first gate electrode GE1. In this example, the third gate electrode GE3 is located away from the second gate electrode GE2 as well as the first gate electrode GE1. The fourth gate electrode GE4 overlaps the third gate electrode GE3.

The semiconductor layer SL1 overlaps the portion in which the first gate electrode GE1 overlaps the second gate electrode GE2. The semiconductor layer SL2 is located away from the semiconductor layer SL1. The semiconductor layer SL2 overlaps the portion in which the third gate electrode GE3 overlaps the fourth gate electrode GE4. Thus, the diode group DG comprises an area in which the first gate electrode GE1, the semiconductor layer SL1 and the second gate electrode GE2 overlap each other, and an area in which the third gate electrode GE3, the semiconductor layer SL2 and the fourth gate electrode GE4 overlap each other.

A first contact hole CH1, a second contact hole CH2, a third contact hole CH3 and a fourth contact hole CH4 are located away from each other.

The first contact hole CH1 is overlaid on a part of the first gate electrode GE1, a part of the semiconductor layer SL1 and a part of the second gate electrode GE2. These parts are exposed from the first contact hole CH1. The second contact hole CH2 is overlaid on a part of the semiconductor layer SL1. This part is exposed from the second contact hole CH2.

The third contact hole CH3 is overlaid on a part of the third gate electrode GE3, a part of the semiconductor layer SL2 and a part of the fourth gate electrode GE4. These parts are exposed from the third contact hole CH3. The fourth contact hole CH4 is overlaid on a part of the semiconductor layer SL2. This part is exposed from the fourth contact hole CH4.

The first electrode E1 is provided in an area overlapping the first contact hole CH1, and is overlaid on a part of the first gate electrode GE1, a part of the semiconductor layer SL1 and a part of the second gate electrode GE2. The second electrode E2 is located away from the first electrode E1. The second electrode E2 is provided in an area overlapping the second contact hole CH2, and is overlaid on a part of the semiconductor layer SL1.

The third electrode E3 is provided in an area overlapping the third contact hole CH3, and is overlaid on a part of the third gate electrode GE3, a part of the semiconductor layer SL2 and a part of the fourth gate electrode GE4. The fourth electrode E4 is located away from the third electrode E3.

The fourth electrode E4 is provided in an area overlapping the fourth contact hole CH4, and is overlaid on a part of the semiconductor layer SL2.

In the present embodiment, the first electrode E1 and the fourth electrode E4 are integrally formed of the same material. The second electrode E2 and the third electrode E3 are integrally formed of the same material.

The thin-film transistor TR3 comprises the semiconductor layer SL1, the first gate electrode GE1, the second gate electrode GE2, the first electrode E1 and the second electrode E2. The thin-film transistor TR4 comprises the semiconductor layer SL2, the third gate electrode GE3, the fourth gate electrode GE4, the third electrode E3 and the fourth electrode E4. In the structure of the diode group DG, for example, the thin-film transistor TR3 and the thin-film transistor TR4 are point-symmetrical with respect to the center CEN of the diode group DG.

Figure 4:
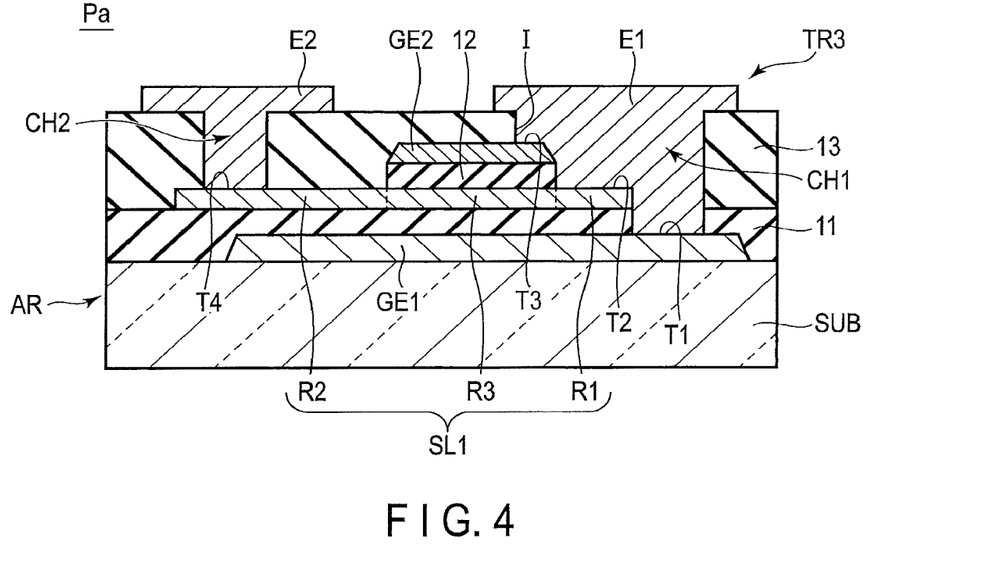
FIG. 4 is a cross-sectional view showing an array substrate along line IV-IV of FIG. 3.

Now, this specification explains the cross-sectional structures of the thin-film transistors TR3 and TR4. In the present embodiment, the structure of the thin-film transistor TR3 is the same as that of the thin-film transistor TR4. Therefore, the thin-film transistor TR3 is explained as a representative example. FIG. 4 is a cross-sectional view showing the array substrate AR along line IV-IV of FIG. 3. FIG. 4 shows a section on a virtual perpendicular surface Pa. The virtual perpendicular surface Pa penetrates the first gate electrode GE1, a first region R1 and the second gate electrode GE2 and is perpendicular to the upper surface of an insulating substrate SUB. FIG. 4 shows the cross-sectional structure of the thin-film transistor TR3.

As shown in FIG. 4, the array substrate AR comprises the insulating substrate SUB. A glass substrate may be used for the insulating substrate SUB. However, a substrate other than a glass substrate may be used for the insulating substrate SUB when, for example, the insulating substrate SUB is used in a way different from the application to the liquid crystal display panel PNL. For example, the insulating substrate SUB may be a resinous substrate. The insulating substrate SUB should have light transmitting property depending on the need.

The first gate electrode GE1 is provided on the insulating substrate SUB and is in contact with the insulating substrate SUB. However, in a manner different from that of the present embodiment, the first gate electrode GE1 may not be in contact with the insulating substrate SUB. An insulating layer may be interposed between the insulating substrate SUB and the first gate electrode GE1.

The semiconductor layer SL1 is provided above the first gate electrode GE1. The semiconductor layer SL1 is formed of amorphous silicon, polycrystalline silicon or a semiconductor such as an organic semiconductor or an oxide semiconductor. The typical examples of the oxide semiconductor include, for example, indium-gallium-zinc oxide (IGZO), indium gallium oxide (IGO), indium zinc oxide (IZO), zinc tin oxide (ZnSnO), zinc oxide (ZnO) and a transparent amorphous oxide semiconductor (TAOS). In the present embodiment, the semiconductor layer SL1 is formed of a TAOS.

The semiconductor layer SL1 includes the first region R1, a second region R2 and a channel region R3. In the present embodiment, the first region R1 functions as a source region, and the second region R2 functions as a drain region. The channel region R3 is located between the first region R1 and the second region R2 and faces the first gate electrode GE1. The first region R1 and the second region R2 are n+ regions. The resistance of the first region R1 and the second region R2 is less than that of the channel region R3.

A first insulating layer 11 is provided on the insulating substrate SUB and the first gate electrode GE1. For example, the first insulating layer 11 is provided between the first gate electrode GE1 and the semiconductor layer SL1. The second gate electrode GE2 is located above the semiconductor layer SL1 and faces the channel region R3. For example, the second gate electrode GE2 is formed of the same material as the scanning lines G and is formed in the same layer as the scanning lines G.

A second insulating layer 12 is provided between the semiconductor layer SL1 and the second gate electrode GE2. In this example, the second insulating layer 12 is provided only on the channel region R3. However, the structure is not limited to this example. The second insulating layer 12 should be provided at least on the channel region R3.

Each of the first and second insulating layers 11 and 12 functions as a gate insulating layer. Thus, the first and second insulating layers 11 and 12 should be preferably formed of an inorganic material which hardly causes a defect such as a short circuit even with a thin layer. Silicon oxide and silicon nitride are considered as examples of the inorganic material. However, the inorganic material is not particularly limited to these examples.

When the resistance of the first and second regions R1 and R2 is decreased, a process for decreasing the resistance of the semiconductor layer SL1 may be performed, using the second insulating layer 12 as a mask. For example, reductive gas plasma treatment such as hydrogen plasma treatment is applied to the exposed semiconductor layer SL1 which is not covered with the second insulating layer 12. In this way, the exposed semiconductor layer SL1 is reduced by reductive hydrogen plasma. Thus, the resistance of the semiconductor layer SL1 is decreased. The semiconductor layer SL1 provided in the area masked by the second insulating layer 12 is not reduced. Thus, a state in which the resistance is comparatively high is maintained in the area. As a result, the first region R1, the second region R2 and the channel region R3 are formed in the semiconductor layer SL1. The method of decreasing the resistance is not particularly limited and may be appropriately selected. For example, reduction may be performed by UV irradiation.

A third insulating layer 13 is provided above the first insulating layer 11, the semiconductor layer SL1, the second insulating layer 12 and the second gate electrode GE2. In this example, the third insulating layer 13 is provided on the first insulating layer 11, the semiconductor layer SL1 and the second gate electrode GE2. The third insulating layer 13 is formed of, for example, an inorganic material.

The first contact hole CH1 penetrates the first insulating layer 11 and the third insulating layer 13, and is located in an area facing the first gate electrode GE1, the first region R1 and the second gate electrode GE2. The second contact hole CH2 penetrates the third insulating layer 13, and is located in an area facing the second region R2.

The first electrode E1 passes through the first contact hole CH1 and electrically connects the first gate electrode GE1, the first region R1 and the second gate electrode GE2. The second electrode E2 passes through the second contact hole CH2 and is electrically connected to the second region R2. For example, the first electrode E1 and the second electrode E2 are formed of the same material as each other in the same layer as the signal lines S.

On the perpendicular surface Pa, the first region R1 and the second gate electrode GE2 are provided in a staircase pattern. A difference is formed on the inner peripheral surface I of the first contact hole CH1. The first electrode E1 is in contact with the upper surface T1 of the first gate electrode GE1, the upper surface T2 of the first region R1, the upper surface T3 of the second gate electrode GE2, etc. The second electrode E2 is in contact with the upper surface T4 of the second region R2, etc.

In the above manner, the display device DSP of the first embodiment comprises the diode-connected thin-film transistors TR2, TR3 and TR4. For example, in each thin-film transistor TR3, the first electrode E1 passes through a single first contact hole CH1, and electrically connects the first gate electrode GE1, the first region R1 and the second gate electrode GE2. The same explanation is applied to each thin-film transistor TR4. In this way, the size of each thin-film transistor TR3 can be reduced in comparison with a case where diodes are connected using a plurality of contact holes. The above structure contributes to a small non-display area NDA. In other words, the structure contributes to the reduction of the size of the frame.

When the semiconductor layer of the thin-film transistor TR1 of each subpixel PX is formed of an oxide semiconductor in the same manner as the thin-film transistors TR3 and TR4, leak current hardly flows in the semiconductor layer. Thus, electrostatic breakdown is easy to cause in each thin-film transistor TR1. However, the protective circuits PC are connected to the scanning lines G and the signal lines S. Thus, it is possible to protect each thin-film transistor TR1 from static electricity.

In the above manner, it is possible to obtain the display device DSP comprising the thin-film transistors TR3 and TR4 which occupy a small area.

(Modification of First Embodiment)

Now, this specification explains the details of the display device DSP according to a modification of the first embodiment. The display device DSP of the modification is different from that of the first embodiment in respect that the thin-film transistors TR3 and TR4 further comprise a conductive layer CL. In this modification, in the same manner as the first embodiment, the structure of the thin-film transistor TR3 is the same as that of the thin-film transistor TR4. In the same manner as the first embodiment, the thin-film transistor TR3 is explained as a representative example.

Figure 5:
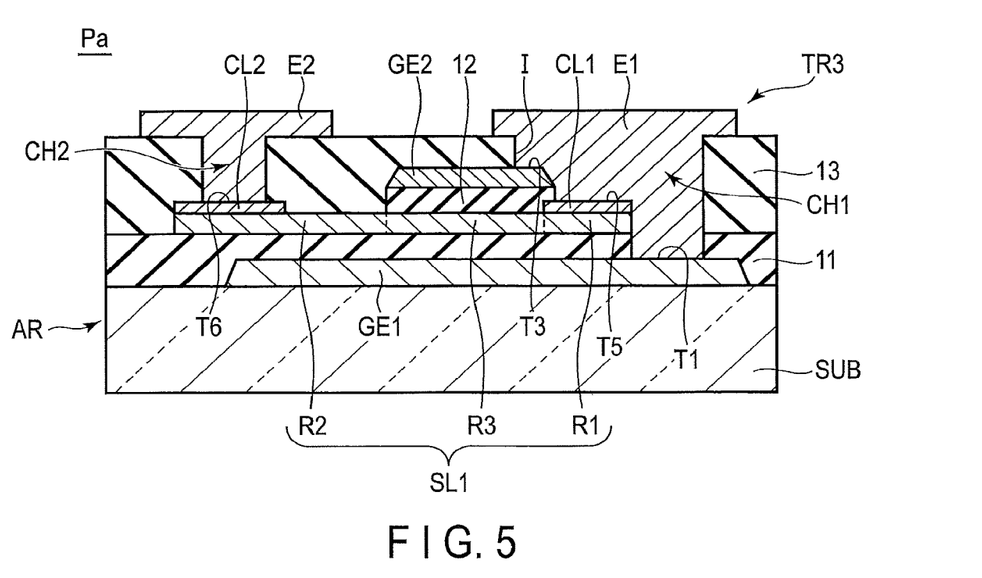
FIG. 5 is a cross-sectional view showing the array substrate of the display device according to a modification of the first embodiment.

FIG. 5 is a cross-sectional view showing the array substrate AR of the display device DSP according to the modification. FIG. 5 shows a section on the virtual perpendicular surface Pa. The virtual perpendicular surface Pa penetrates the first gate electrode GE1, the first region R1, a first conductive layer CL1 and the second gate electrode GE2 and is perpendicular to the upper surface of the insulating substrate SUB. FIG. 5 shows the cross-sectional structure of the thin-film transistor TR3.

As shown in FIG. 5, the thin-film transistor TR3 further comprises the first conductive layer CL1 and a second conductive layer CL2. The first conductive layer CL1 is provided on the first region R1 and is in contact with the first region R1. The second conductive layer CL2 is provided on the second region R2 and is in contact with the second region R2. The first contact hole CH1 further faces the first conductive layer CL1. The first electrode E1 is electrically connected to the first conductive layer CL1. The second contact hole CH2 faces the second conductive layer CL2. The second electrode E2 is electrically connected to the second conductive layer CL2.

On the perpendicular surface Pa, the first conductive layer CL1 and the second gate electrode GE2 are provided in a staircase pattern. A difference is formed on the inner peripheral surface I of the first contact hole CH1. The first electrode E1 is in contact with the upper surface T1 of the first gate electrode GE1, the upper surface T5 of the first conductive layer CL1, the upper surface T3 of the second gate electrode GE2, etc. The second electrode E2 is in contact with the upper surface T6 of the second conductive layer CL2, etc.

In the display device DSP of the modification of the first embodiment having the above structure, each thin-film transistor TR3 may comprise the first conductive layer CL1. The first electrode E1 is connected to the first conductive layer CL1. In a manner similar to that of the first embodiment, the present modification can achieve the thin-film transistors TR3 and TR4 which occupy a small area.

Second Embodiment

Now, this specification explains the details of a display device DSP according to a second embodiment. The display device DSP of the present embodiment is different from that of the first embodiment in respect that thin-film transistors TR3 and TR4 share a single semiconductor layer SL. In the second embodiment, in a manner different from that of the first embodiment, none of a third gate electrode GE3, a fourth gate electrode GE4, a semiconductor layer SL2, a third electrode E3 and a fourth electrode E4 is provided in a diode group DG.

Figure 6:
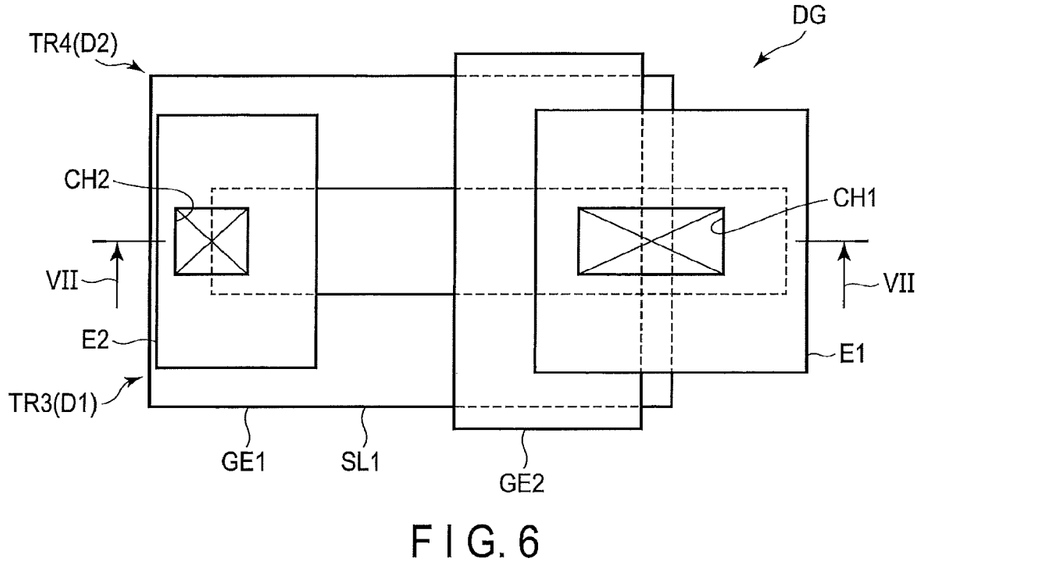
FIG. 6 is a plan view showing a part of a protective circuit in a display device according to a second embodiment.

FIG. 6 is a plan view showing a part of a protective circuit PC in the display device DSP according to the second embodiment. Here, a single diode group DG of the protective circuit PC is explained as an example.

As shown in FIG. 6, the diode group DG comprises the diode-connected thin-film transistor TR3 and the diode-connected thin-film transistor TR4. The thin-film transistor TR3 comprises a semiconductor layer SL1, a first gate electrode GE1, a first electrode E1 and a second electrode E2. The thin-film transistor TR4 comprises the semiconductor layer SL1, a second gate electrode GE2, the first electrode E1 and the second electrode E2.

A first contact hole CH1 is overlaid on a part of the semiconductor layer SL1 and a part of the second gate electrode GE2. These parts are exposed from the first contact hole CH1. A second contact hole CH2 is overlaid on a part of the first gate electrode GE1 and a part of the semiconductor layer SL1. These parts are exposed from the second contact hole CH2.

The first electrode E1 is provided in an area overlapping the first contact hole CH1, and is overlaid on a part of the semiconductor layer SL1 and a part of the second gate electrode GE2. The second electrode E2 is provided in an area overlapping the second contact hole CH2, and is overlaid on a part of the first gate electrode GE1 and a part of the semiconductor layer SL1.

Figure 7:
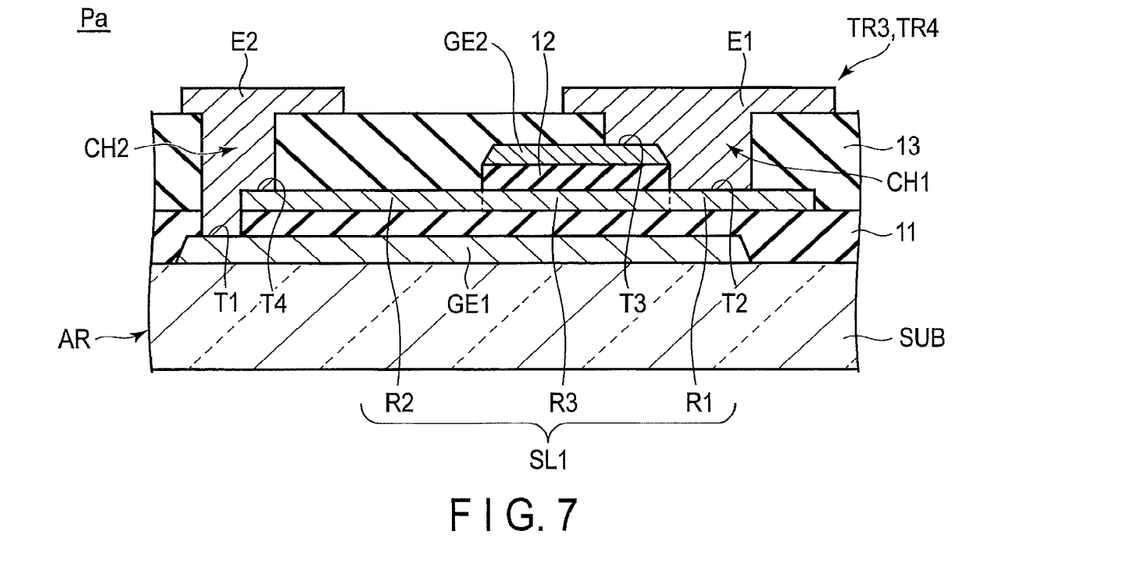
FIG. 7 is a cross-sectional view showing an array substrate along line VII-VII of FIG. 6.

Now, this specification explains the cross-sectional structures of the thin-film transistors TR3 and TR4. FIG. 7 is a cross-sectional view showing an array substrate along line VII-VII of FIG. 6. FIG. 7 shows the cross-sectional structures of the thin-film transistors TR3 and TR4.

As shown in FIG. 7, the first contact hole CH1 penetrates a third insulating layer 13, and is located in an area facing a first region R1 and the second gate electrode GE2. The second contact hole CH2 penetrates a first insulating layer 11 and the third insulating layer 13, and is located in an area facing the first gate electrode GE1 and a second region R2.

The first electrode E1 passes through the first contact hole CH1 and electrically connects the first region R1 and the second gate electrode GE2. The second electrode E2 passes through the second contact hole CH2 and is electrically connected to the first gate electrode GE1 and the second region R2. The first electrode E1 is in contact with the upper surface T2 of the first region R1, the upper surface T3 of the second gate electrode GE2, etc. The second electrode E2 is in contact with the upper surface T1 of the first gate electrode GE1, the upper surface T4 of the second region R2, etc.

In the above manner, the display device DSP of the second embodiment comprises the diode-connected thin-film transistors TR2, TR3 and TR4. For example, in each thin-film transistor TR3, the second electrode E2 passes through a single second contact hole CH2, and electrically connects the first gate electrode GE1 and the second region R2. In each thin-film transistor TR4, the first electrode E1 passes through a single first contact hole CH1, and electrically connects the first region R1 and the second gate electrode GE2.

In this way, the size of the thin-film transistors TR3 and TR4 can be reduced in comparison with a case where diodes are connected using a plurality of contact holes. In the second embodiment, the thin-film transistors TR3 and TR4 share a single semiconductor layer SL1. This structure contributes to a small non-display area NDA. In other words, the structure contributes to the reduction of the size of the frame.

In the above manner, it is possible to obtain the display device DSP comprising the thin-film transistors TR3 and TR4 which occupy a small area.

(Modification of Second Embodiment)

Figure 8:
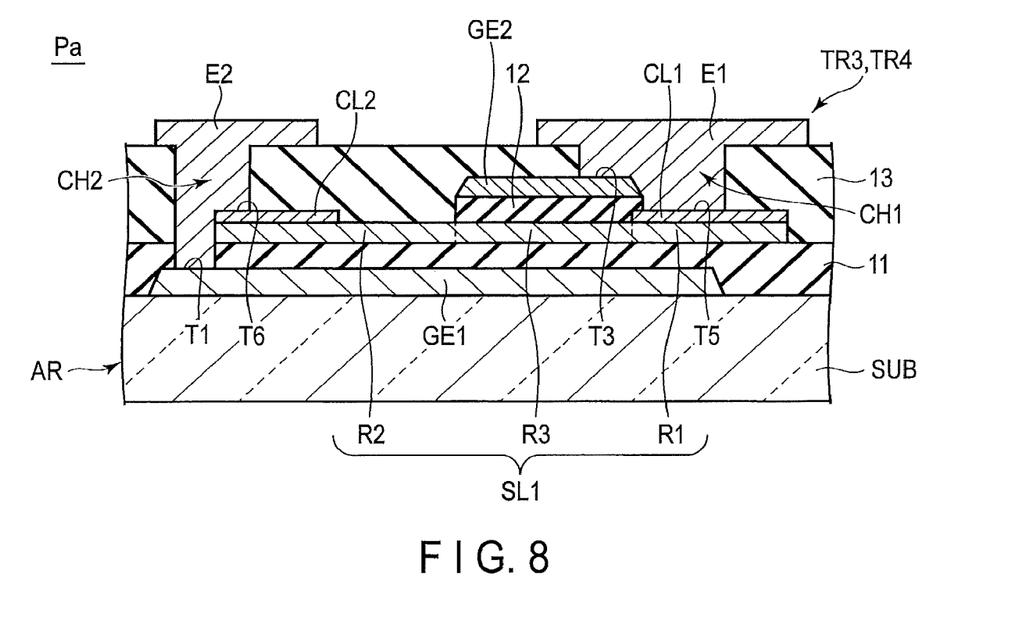
FIG. 8 is a cross-sectional view showing the array substrate of the display device according to a modification of the second embodiment.

Now, this specification explains the details of the display device DSP according to a modification of the second embodiment. The display device DSP of the modification is different from that of the second embodiment in respect that the thin-film transistors TR3 and TR4 further comprise a conductive layer CL. FIG. 8 is a cross-sectional view showing the array substrate AR in the display device DSP according to the modification. FIG. 8 shows the cross-sectional structures of the thin-film transistors TR3 and TR4.

As shown in FIG. 8, the thin-film transistors TR3 and TR4 further comprise a first conductive layer CL1 and a second conductive layer CL2. The first conductive layer CL1 is provided on the first region R1 and is in contact with the first region R1. The second conductive layer CL2 is provided on the second region R2 and is in contact with the second region R2. The first contact hole CH1 further faces the first electrically connected to the first conductive layer CL1. The second contact hole CH2 faces the second conductive layer CL2. The second electrode E2 is electrically connected to the second conductive layer CL2.

The first electrode E1 is in contact with the upper surface T5 of the first conductive layer CL1, the upper surface T3 of the second gate electrode GE2, etc. The second electrode E2 is in contact with the upper surface T1 of the first gate electrode GE1, the upper surface T6 of the second conductive layer CL2, etc.

In the display device DSP of the modification of the second embodiment having the above structure, the thin-film transistors TR3 and TR4 may comprise the first conductive layer CL1 and the second conductive layer CL2. In a manner similar to that of the second embodiment, the present modification can achieve the thin-film transistors TR3 and TR4 which occupy a small area.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. It is possible to combine two or more of the embodiments and modifications with each other if needed.

For example, the technique related to the above thin-film transistors TR3 and TR4 may be applied to the thin-film transistors TR2. In other words, a diode-connected thin-film transistor TR2 may be formed by connection using a single contact hole.

Each protective circuit PC may comprise a single type of diodes D which are the first diodes D1 or the second diodes D2.

In the above embodiments, a liquid crystal display device is disclosed as an example of display devices. However, the above embodiments may be applied to various flat-panel or flexible display devices such as organic electroluminescent (EL) display devices, other self-luminance display devices or electronic paper display devices comprising an electrophoretic element. As a matter of course, the above embodiments may be applied to small, medium and large display devices without limitation.

The above thin-film transistors TR may be applied to semiconductor devices other than display devices, such as various memories and sensors.

What is claimed is:

1. A semiconductor device comprising:
a first gate electrode;
a semiconductor layer which is provided above the first gate electrode, and includes a first region, a second region and a channel region located between the first region and the second region and facing the first gate electrode;
a first insulating layer provided between the first gate electrode and the semiconductor layer;
a second gate electrode located above the semiconductor layer and facing the channel region;
a second insulating layer provided between the semiconductor layer and the second gate electrode;
a third insulating layer provided above the first insulating layer, the semiconductor layer, the second insulating layer and the second gate electrode;
a first contact hole penetrating the first insulating layer and the third insulating layer, and located in an area facing the first gate electrode, the first region and the second gate electrode; and
a first electrode passing through the first contact hole and electrically connecting the first gate electrode, the first region and the second gate electrode,
wherein
each of the first gate electrode and the second gate electrode is not in direct contact with the semiconductor layer.

2. The semiconductor device of claim 1, wherein
on a virtual perpendicular surface penetrating the first gate electrode, the first region and the second gate electrode, the first region and the second gate electrode are provided in a staircase pattern and form a difference on an inner peripheral surface of the first contact hole, and
the first electrode is in contact with an upper surface of the first gate electrode, an upper surface of the first region and an upper surface of the second gate electrode.

3. The semiconductor device of claim 1, further comprising a first conductive layer which is provided on the first region and is in contact with the first region, wherein
the first contact hole faces the first conductive layer, and
the first electrode is electrically connected to the first conductive layer.

4. The semiconductor device of claim 3, wherein
on a virtual perpendicular surface penetrating the first gate electrode, the first conductive layer and the second gate electrode, the first conductive layer and the second gate electrode are provided in a staircase pattern and form a difference on an inner peripheral surface of the first contact hole, and
the first electrode is in contact with an upper surface of the first gate electrode, an upper surface of the first conductive layer and an upper surface of the second gate electrode.

5. The semiconductor device of claim 1, wherein
the semiconductor layer is formed of an oxide semiconductor.

6. A semiconductor device comprising:
a first gate electrode;
a semiconductor layer which is provided above the first gate electrode, and includes a first region, a second region and a channel region located between the first region and the second region and facing the first gate electrode;
a first insulating layer provided between the first gate electrode and the semiconductor layer;
a second gate electrode located above the semiconductor layer and facing the channel region;
a second insulating layer provided between the semiconductor layer and the second gate electrode;
a third insulating layer provided above the first insulating layer, the semiconductor layer, the second insulating layer and the second gate electrode;
a first contact hole penetrating the third insulating layer, and located in an area facing the first region and the second gate electrode;
a first electrode passing through the first contact hole, and electrically connecting the first region and the second gate electrode;
a second contact hole penetrating the first insulating layer and the third insulating layer, and located in an area facing the first gate electrode and the second region; and
a second electrode passing through the second contact hole, and electrically connecting the first gate electrode and the second region,
wherein
each of the first gate electrode and the second gate electrode is not in direct contact with the semiconductor layer.

7. The semiconductor device of claim 6, wherein
the first electrode is in contact with an upper surface of the first region and an upper surface of the second gate electrode, and
the second electrode is in contact with an upper surface of the first gate electrode and an upper surface of the second region.

8. The semiconductor device of claim 6, further comprising:
a first conductive layer which is provided on the first region and is in contact with the first region; and
a second conductive layer which is provided on the second region and is in contact with the second region, wherein
the first contact hole faces the first conductive layer, the first electrode is electrically connected to the first conductive layer, the second contact hole faces the second conductive layer, and the second electrode is electrically connected to the second conductive layer.

9. The semiconductor device of claim 8, wherein the first electrode is in contact with an upper surface of the first conductive layer and an upper surface of the second gate electrode, and the second electrode is in contact with an upper surface of the first gate electrode and an upper surface of the second conductive layer.

10. The semiconductor device of claim 6, wherein the semiconductor layer is formed of an oxide semiconductor.

\* \* \* \* \*